United States Patent [19]

Takahashi

[11] Patent Number: 5,567,647
[45] Date of Patent: Oct. 22, 1996

[54] METHOD FOR FABRICATING A GATE ELECTRODE STRUCTURE OF COMPOUND SEMICONDUCTOR DEVICE

[75] Inventor: Kiyoshi Takahashi, Tokyo, Japan

[73] Assignee: NEC Corporation, Tokyo, Japan

[21] Appl. No.: 354,067

[22] Filed: Dec. 6, 1994

[30] Foreign Application Priority Data

Dec. 7, 1993 [JP] Japan ................................. 5-306203

[51] Int. Cl.⁶ ............................................... H01L 21/28
[52] U.S. Cl. ......................... 437/177; 437/179; 437/192; 437/200
[58] Field of Search ................................. 437/177, 178, 437/179, 192, 200, 183

[56] References Cited

U.S. PATENT DOCUMENTS 5,162,262  11/1992  Ajiko et al. .......................... 437/200

FOREIGN PATENT DOCUMENTS 63-51679   3/1988   Japan .
3-224268   3/1991   Japan ................................. 437/177
3-222362   10/1991  Japan ................................. 437/176

*Primary Examiner*—George Fourson
*Assistant Examiner*—Thomas G. Bilodeau
*Attorney, Agent, or Firm*—Popham Haik Schnobrich & Kaufman, Ltd.

[57] ABSTRACT

A method for fabricating a gate electrode structure of a semiconductor device includes the steps of forming a refractory metal layer of such as tungsten over a substrate, a nitride layer of such as tungsten nitride on the refractory metal layer, and a low resistance metal layer of such as gold (Au) on the nitride layer, and etching and removing the portions of the refractory metal layer and the nitride layer that are existing outside a predetermined region. In place of the refractory metal layer, the refractory metal compound layer may be used. The nitride layer is formed by introducing a nitrogen gas into a sputtering system where reactive sputtering is carried out. Without sacrificing the reliability of the gate or barrier characteristics, it is possible to reduce the number of process steps otherwise required.

11 Claims, 4 Drawing Sheets

METHOD FOR FABRICATING A GATE ELECTRODE STRUCTURE OF COMPOUND SEMICONDUCTOR DEVICE

BACKGROUND OF THE INVENTION (1) Field of the Invention

The present invention relates to a method for fabricating a semiconductor device, and more particularly to a method for fabricating a gate electrode structure of a compound semiconductor device.

(2) Description of the Related Art

Conventionally, for forming an electrode structure of a semiconductor device, especially for forming a heat resistance gate electrode of a GaAs FET, the film formation is carried out, as shown in FIG. 1A as a first prior art example, such that an operating layer (n-GaAs) 12 is first formed on a GaAs substrate 11 by an epitaxial growth process, etc. and then, as shown in FIG. 1B, a refractory metal layer or a refractory metal compound layer 31 is deposited by a vapor deposition process, a sputtering process, etc. On the resulting surface, a titanium nitride layer 32 and also a gold layer 16 are sequentially deposited by a vapor deposition process, a sputtering process, etc. and then, as shown in FIG. 1C, the gold layer 16 is processed by an ion milling using a photoresist 15 as a mask, and further the titanium nitride layer 32 and the refractory metal (or compound) 31 are processed by a reactive ion etching (RIE) process using the gold layer 16 as a mask, whereby a gate electrode structure is formed (FIG. 1D).

The gold layer 16 is formed in order to reduce the gate resistance, and the titanium nitride layer 32 is formed in order to enhance the adhering properties of the refractory metal (or compound) 31 and the gold layer 16 and, during the thermal treatment at about 500° C., to act as a barrier metal to prevent the gold 16 from transmitting through the refractory metal (or compound) 31 to be diffused to the GaAs substrate 11 and to deteriorate Schottky characteristics (Japanese Patent Application Kokai Publication No. Sho 63-51679).

Also, in a second prior art example, after a silicon oxide film 21 is grown over the GaAs substrate 11 having the operating layer (n-GaAs) 12 as shown in FIG. 2A, an opening is formed in the silicon oxide film 21 by a reactive ion etching process using a photoresist as a mask. Then, as shown in FIG. 2B, formed on the resulting entire surface are a refractory metal (or compound) layer 31, a titanium nitride layer 32 and a platinum layer 41 by a vapor deposition process, a sputtering process, etc. Next, as shown in FIG. 2C, after a gold layer 16 is formed by a plating process using a photoresist 15 as a mask and a platinum 41 as plating pass, the platinum layer 41 is processed by an ion milling process, and the titanium nitride layer 32 and the refractory metal (or compound) layer 31 are processed by a reactive ion etching by using a gold layer 16 as a mask (FIG. 2D).

However, in the multi-layer structure composed of the refractory metal (or compound) layer, the titanium nitride layer and the gold layer as in the above first prior art example, a sputter etching step using an argon ion gas is required after the formation of the refractory metal (or compound) layer in order to enhance the adhering property of the titanium nitride and to clean the surface of the refractory metal (or compound) layer and, in the process of forming the electrode after the formation of metal films, an ion milling process is required for processing the gold and a reactive ion etching process is required for processing the titanium nitride and the refractory metal (or compound) layer, which results in an increase in the number of steps in the process. Also, since the ion milling is used, fine metal chips produced during the milling tend to adhere to peripheral portions of the electrode thereby causing the occurrence of electric short-circuiting and operational failure.

Also, in the second prior art example, due to an advancement of the miniaturization of a gate electrode, it makes it difficult, after the formation of the refractory metal (or compound) layer, to sufficiently fill inside the gate with the titanium nitride, thereby reducing the function thereof as a barrier metal and reducing the reliability of the gate electrode.

SUMMARY OF THE INVENTION

An object of the invention, therefore, is to overcome the problems existing in the prior art and to provide a semiconductor device having a gate electrode which can be fabricated with a smaller number of process steps and which has a barrier metal layer with excellent embeddability.

According to one aspect of the invention, there is provided a method for fabricating an electrode of a semiconductor device, the method comprising the steps of:

forming one of a refractory metal layer and a refractory metal compound layer over a substrate;

forming a nitride layer on a surface of one of the refractory metal layer and the refractory metal compound layer by introducing a nitrogen gas;

forming a low resistance metal layer on the nitride layer; and etching and removing one of the refractory metal layer and the refractory metal compound layer, and the nitride layer, that are existing outside a predetermined region.

PREFERRED EMBODIMENTS OF THE INVENTION

Now, preferred embodiments of the invention are explained with reference to the drawings.

Figure 1A:
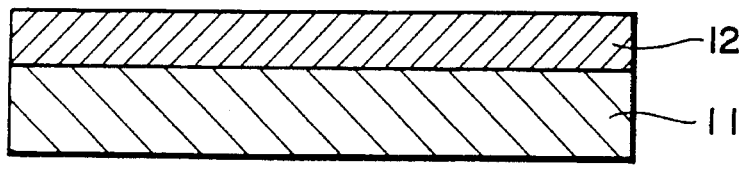
FIGS. 1A–1D show a prior art example of forming an electrode structure of a semiconductor device.
Figure 1B:
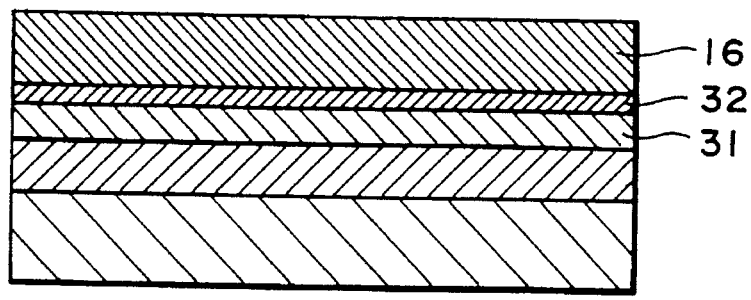
Figure 1C:
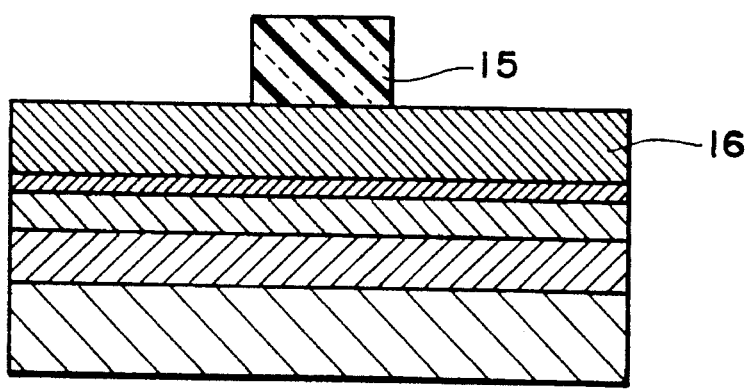
Figure 1D:
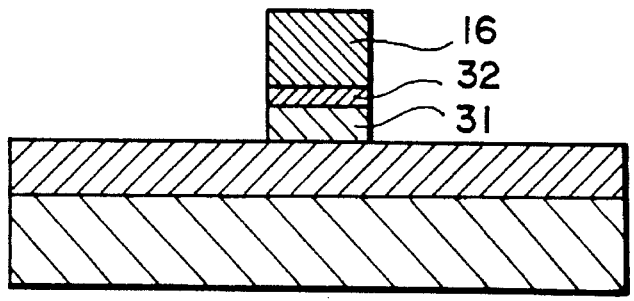
Figure 2A:
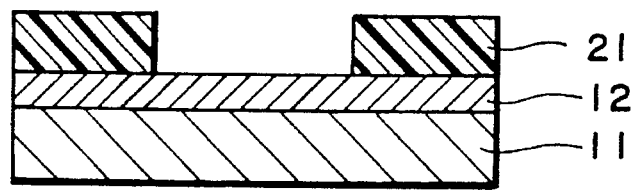
FIGS. 2A–2D show a second prior art example of forming an electrode structure of a semiconductor device.
Figure 2B:
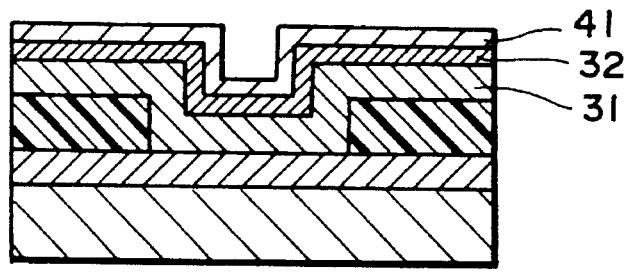
Figure 2C:
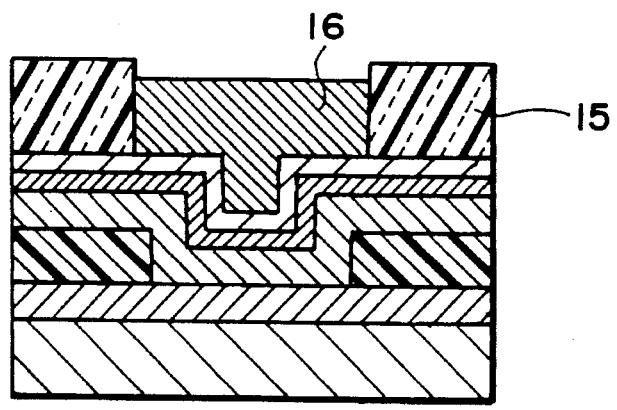
Figure 2D:
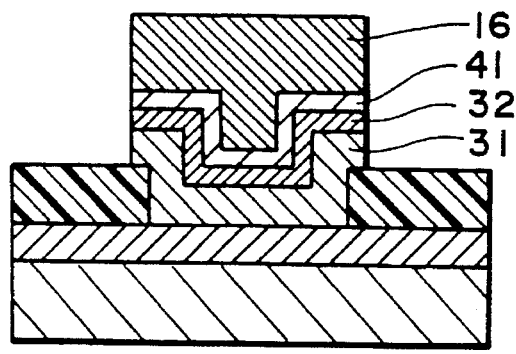
Figure 3A:
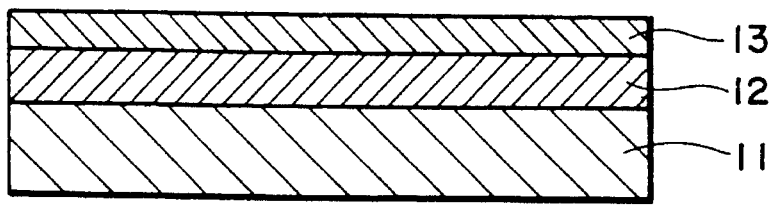
FIGS. 3A–3D are sectional views of a structure of a first embodiment of the present invention.
Figure 3B:
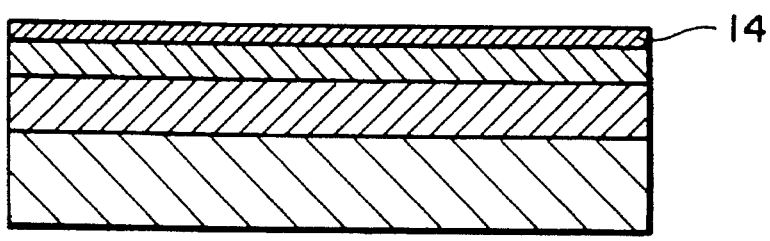
Figure 3C:
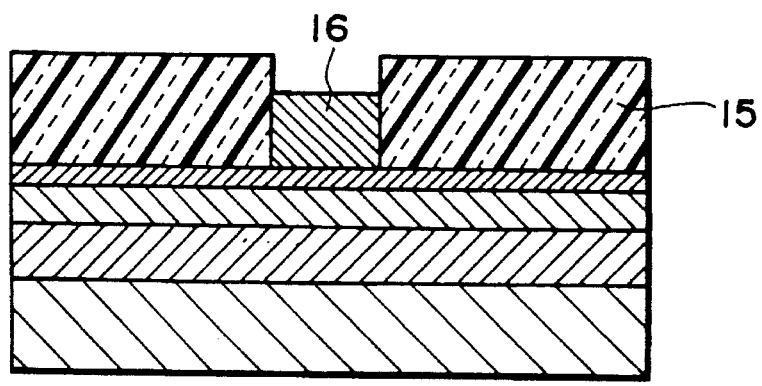
Figure 3D:
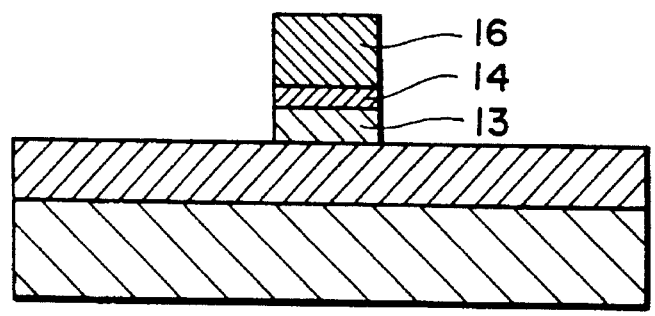

FIGS. 3A–3D show in sectional views a structure of a first embodiment of the invention for explaining sequential steps of a process for forming a gate electrode of a GaAs FET. First, over a GaAs substrate 11 on a surface of which a layer such as an operating layer 12 is formed by an epitaxial growth method, a tungsten film 13 having a thickness of 1000 Angstroms is formed by a sputtering process (FIG. 3A). Then, in the same sputtering system, a nitrogen gas in a 10% flow rate of the total flow rate of the argon gas and the nitrogen gas is introduced and a reactive sputtering process is carried out, thereby forming on the tungsten film 13 a tungsten nitride film 14 having a composition ratio of tungsten and nitrogen as being 1:1 and having a thickness of 500 Angstroms (FIG. 3B). Further, by using a patterned photoresist 15 as a mask, a gold film 16 is formed by plating (FIG. 3C) and, after the photoresist 15 is removed, the tungsten nitride film 14 and the tungsten film 13 are processed by a reactive etching of a $SF_6$ based gas by using a gold film 16 as a mask, whereby the gate electrode is formed (FIG. 3D).

In this embodiment, the composition ratio in the tungsten nitride film 14 is 1:1 (tungsten:nitrogen) and the thickness thereof is 500 Angstroms. In this composition ratio, an increase in the nitrogen enhances the barrier property of the film but it also advances the resistivity, so that the most suitable composition ratio is 1:1. The resistivity becomes substantially the same as that of the platinum at $15 \times 10^{-6}$ ($\Omega \cdot cm$) so that the gold film 16 can be formed directly by plating. The barrier property is enhanced with an increase in the film thickness. However, where the film thickness is larger than 500 Angstroms, since no diffusion of the gold 16 has been detected at the operating layer (n-GaAs) 12 in the SIMS (Secondary Ion Mass Spectroscopy) analysis after the heat treatment at the temperature of 800° C., it is considered that the barrier property attained at 500 Angstroms is sufficient. In this embodiment, the sputtering step when the titanium nitride is used and the milling step which becomes a cause for operation failure have been dispensed with.

Figure 4A:
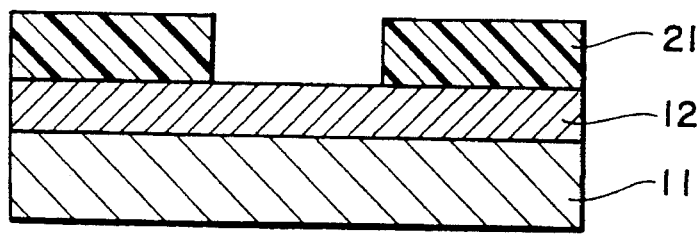
FIGS. 4A–4D are sectional views of a structure of a second embodiment of the present invention.
Figure 4B:
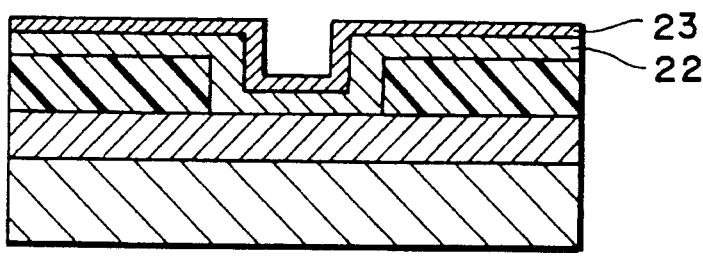
Figure 4C:
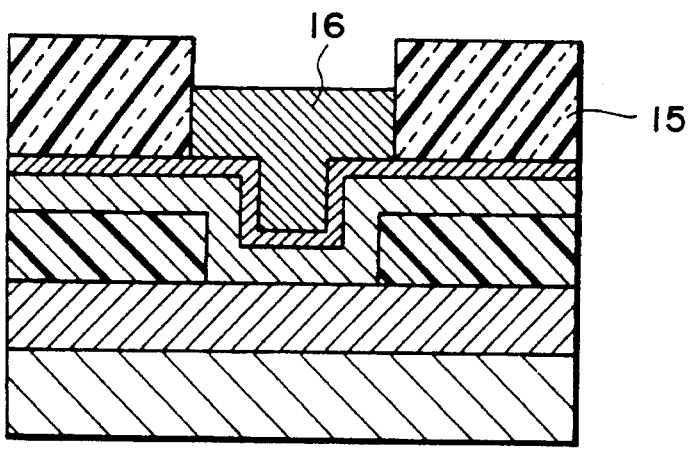
Figure 4D:
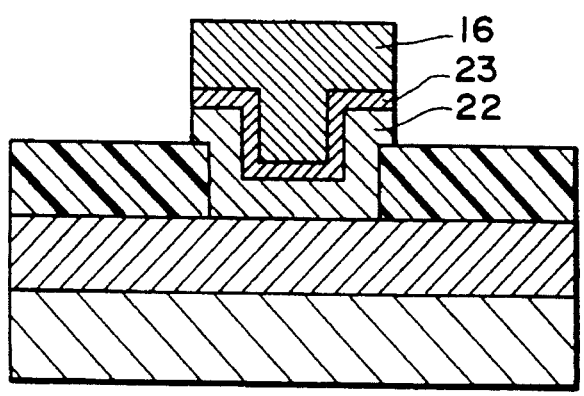

Next, FIGS. 4A–4D show in sectional views a structure of a second embodiment of the invention for explaining sequential steps of another process for forming a gate electrode of a GaAs FET. In this embodiment, after a silicon oxide film 21 is grown over a GaAs substrate 11 and an operating layer (n-GaAs) 12, an opening is formed in this silicon oxide film 21 by a reactive ion etching process using a photoresist as a mask (FIG. 4A), a tungsten silicide film 22 having a thickness of 1000 Angstroms is formed over the entire surface by a sputtering process (FIG. 3A), and then a reactive sputtering process is carried out by introducing into a sputtering system a nitrogen gas under a partial pressure of 15% of an argon gas+nitrogen flow, whereby a tungsten nitride silicide film 23 having a thickness of 500 Angstroms is formed (FIG. 4B). Next, by using a photoresist 15 as a mask, a gold film 16 is formed by plating (FIG. 4C) and, after the removal of the photoresist 15, a tungsten nitride silicide film 23 and a tungsten silicide film 22 are processed by a reactive etching using a $SF_6$ based gas, whereby a gate electrode having a T-shape in cross-section is formed (FIG. 4D).

The T-shaped gate requires that, in order to enhance its characteristics, the opening width, that is, the gate length, of the silicon oxide film 21 be small and the film thickness of the silicon oxide film 21 be thick. In this embodiment, the tungsten nitride silicide film 22 is formed continuously as a barrier metal layer on the tungsten silicide layer 22 and the tungsten nitride silicide film 23 makes a replica of the tungsten nitride silicide film 22, so that the embeddability to the opening is good.

According to the invention, after the refractory metal (or compound) layer is formed by sputtering, the nitride film of refractory metal (or compound) is formed by a reactive sputtering process using a nitrogen gas introduced in the sputtering system, thereby providing a gate electrode which excels in adhering and barrier properties and in embeddability and which involves a smaller number of process steps. Especially as to the barrier properties, no diffusion of gold (Au) to the substrate side is observed in the SIMS analysis made before and after the annealing at 800° C.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating an electrode of a semiconductor device, the method comprising the steps of:
    forming one of a refractory metal layer and a refractory metal compound layer over a compound semiconductor substrate in a sputtering system;
    forming a nitride layer on a surface of one of said refractory metal layer and said refractory metal compound layer by a reactive sputtering process using a nitrogen containing gas introduced into said sputtering system, wherein said nitride layer comprises a nitride of one of said refractory metal and refractory metal compound;
    selectively forming a metal film on said nitride layer by plating using said nitride layer as an electrode; and
    removing one of said refractory metal layer and said refractory metal compound layer, and said nitride layer by etching using said metal film as a mask.

2. The method for fabricating an electrode of a semiconductor device according to claim 1, in which said refractory metal layer is made of tungsten.

3. The method for fabricating an electrode of a semiconductor device according to claim 1, in which said nitride layer is made of tungsten nitride.

4. The method for fabricating an electrode of a semiconductor device according to claim 1, in which said refractory metal compound layer is made of tungsten silicide.

5. The method for fabricating an electrode of a semiconductor device according to claim 1, in which said metal film is made of gold.

6. A method for fabricating an electrode of a T-shape in cross-section of a semiconductor device, said method comprising the steps of:
    depositing a silicon oxide film on a compound semiconductor substrate;
    forming an opening in said silicon oxide film by reactive ion etching using a first photoresist as a mask;
    forming one of a refractory metal layer and a refractory metal compound layer on an upper resultant surface in a sputtering system;
    forming a nitride layer on a surface of one of said refractory metal layer and said refractory metal compound layer by a reactive sputtering process using a nitrogen containing gas introduced into said sputtering system, wherein said nitride layer comprises a nitride of one of said refractory metal and refractory metal compound;
    selectively forming a metal film on said nitride layer using a second photoresist as a mask and by plating using said nitride layer as an electrode; and
    after a removal of said second photoresist, removing said nitride layer and, one of said refractory metal layer and said refractory metal compound layer by etching using said metal film as a mask.

7. The method for fabricating an electrode of a T-shape in cross-section of a semiconductor device according to claim 6, in which said refractory metal layer is made of tungsten.

8. The method for fabricating an electrode of a T-shape in cross-section of a semiconductor device according to claim 6, in which said nitride layer is made of tungsten nitride.

9. The method for fabricating an electrode of a T-shape in cross-section of a semiconductor device according to claim 6, in which said refractory metal compound layer is made of tungsten silicide.

10. The method for fabricating an electrode of a T-shape in cross-section of a semiconductor device according to claim 6, in which said metal film is made of gold.

11. The method for fabricating an electrode of a semiconductor device according to claim 1 wherein a patterned photoresist is applied to said nitride film before applying said gold layer and wherein said patterned photoresist is removed before said etching of said nitride layer.

* * * * *